(12) United States Patent
Kondo et al.

(10) Patent No.: US 9,472,438 B2
(45) Date of Patent: *Oct. 18, 2016

(54) WAFER PROCESSING LAMINATE, WAFER PROCESSING MEMBER, TEMPORARY ADHERING MATERIAL FOR PROCESSING WAFER, AND MANUFACTURING METHOD OF THIN WAFER

(71) Applicant: SHIN-ETSU CHEMICAL CO., LTD., Tokyo (JP)

(72) Inventors: Kazunori Kondo, Takasaki (JP); Hideto Kato, Takasaki (JP); Michihiro Sugo, Takasaki (JP); Shohei Tagami, Annaka (JP); Hiroyuki Yasuda, Tomioka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 384 days.

This patent is subject to a terminal disclaimer.

(21) Appl. No.: 14/043,327

(22) Filed: Oct. 1, 2013

(65) Prior Publication Data
US 2014/0106137 A1    Apr. 17, 2014

(30) Foreign Application Priority Data

Oct. 11, 2012  (JP) ................................. 2012-225664
Jul. 26, 2013  (JP) ................................. 2013-155492

(51) Int. Cl.
*H01L 21/683* (2006.01)
*H01L 21/78* (2006.01)

(52) U.S. Cl.
CPC ....... *H01L 21/6836* (2013.01); *H01L 21/6835* (2013.01); *H01L 21/78* (2013.01); *H01L 2221/6834* (2013.01); *H01L 2221/68327* (2013.01); *H01L 2221/68381* (2013.01); *Y10T 428/24802* (2015.01)

(58) Field of Classification Search
CPC .................... Y10T 428/21; Y10T 428/24802
See application file for complete search history.

(56) References Cited

U.S. PATENT DOCUMENTS

| | | | |
|---|---|---|---|
| 7,541,264 B2 | 6/2009 | Gardner et al. | |
| 8,999,817 B2* | 4/2015 | Tagami | C09J 7/00 438/464 |
| 2005/0233547 A1 | 10/2005 | Noda et al. | |
| 2013/0029145 A1* | 1/2013 | Kato | C09J 183/04 428/354 |
| 2013/0108866 A1* | 5/2013 | Kato | C08G 77/52 428/354 |

FOREIGN PATENT DOCUMENTS

| | | |
|---|---|---|
| JP | A-2004-064040 | 2/2004 |
| JP | A-2006-328104 | 12/2006 |

* cited by examiner

*Primary Examiner* — Gerard Higgins
(74) *Attorney, Agent, or Firm* — Oliff PLC

(57) ABSTRACT

A wafer processing laminate, a wafer processing member, a temporary adhering material for processing wafer, and a method for manufacturing a thin wafer using the same. The wafer processing laminate includes a support, a temporary adhesive material layer formed thereon and a wafer laminated on the temporary adhesive material layer, where the wafer has a circuit-forming front surface and a back surface to be processed. The temporary adhesive material layer includes a first temporary adhesive layer of a thermoplastic organopolysiloxane polymer layer (A) releasably adhered on a surface of the wafer, a second temporary adhesive layer of a radiation curable polymer layer (B) laminated on the first temporary adhesive layer, and a third temporary adhesive layer of a thermoplastic organopolysiloxane polymer layer (A') laminated on the second temporary adhesive layer and releasably adhered to the support.

28 Claims, 1 Drawing Sheet

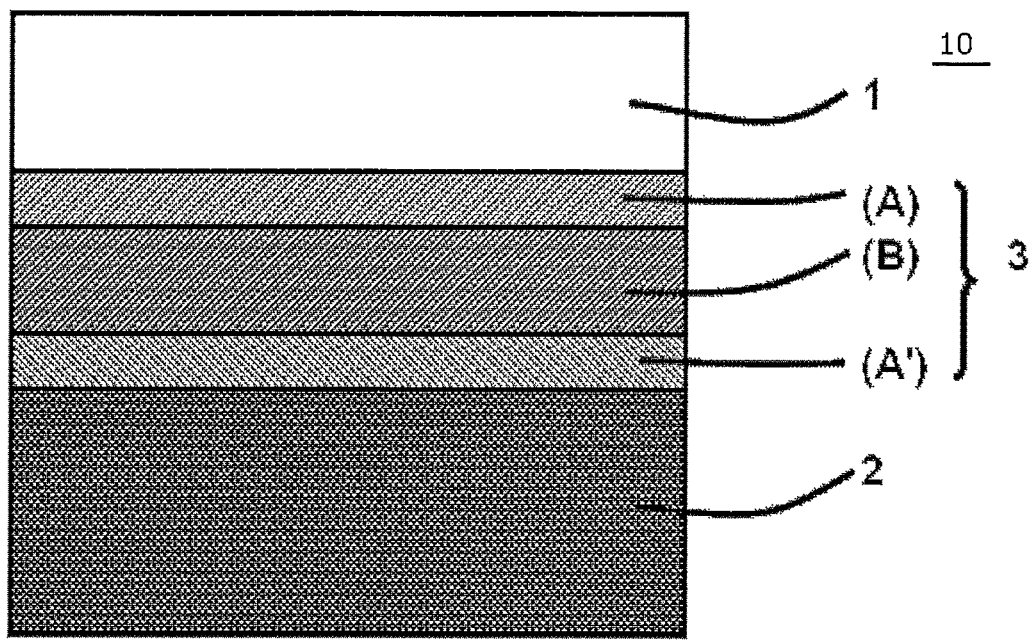

WAFER PROCESSING LAMINATE, WAFER PROCESSING MEMBER, TEMPORARY ADHERING MATERIAL FOR PROCESSING WAFER, AND MANUFACTURING METHOD OF THIN WAFER

TECHNICAL FIELD

The present invention relates to a wafer processing laminate which can realize to obtain a thin wafer effectively, a wafer processing member, a temporary adhering material for processing a wafer, and a method for manufacturing a thin wafer.

BACKGROUND ART

Three-dimensional semiconductor packages become essential for a higher density and larger capacity. The three-dimensional packaging technology is by thinning semiconductor chips, and laminating them in multilayer structure while providing through silicon via (TSV) interconnects. For realizing the above, it is required to conduct the steps of thinning a substrate having a semiconductor circuit formed thereon by grinding its non-circuit-forming surface (it is also called as "back surface"), and further forming electrodes including TSV on the back surface. In the prior art, prior to the step of grinding the back surface of a silicon substrate, a protective tape is adhered to the back surface of the substrate opposite to the surface to be ground for preventing the wafer from breakage during the grinding step. However, this tape uses an organic resin film as a base material, it is flexible, but is insufficient in strength and heat resistance to withstand the TSV forming step and the step of forming interconnects on the back surface so that it is not suitable.

It is then proposed to bond a semiconductor substrate to a support such as silicon and glass via an adhesive layer whereby it becomes a system to sufficiently withstand the steps of grinding a back surface, and forming TSV or electrodes on the back surface. The adhesive layer is important for this system to bond the substrate to the support. The adhesive layer is required to bond the substrate to the support without leaving gaps, to have sufficient durability which can withstand the subsequent steps, and eventually allow the thin wafer to be easily released from the support. The adhesive layer is thus finally released so that, in the present specification, the adhesive layer is referred to as a temporary adhesive layer (or a temporary adhesive material layer).

With regard to the conventionally known temporary adhesive layers and an delaminating method thereof, there have been proposed a technique in which high intensity light is irradiated to an adhesive material containing a light absorbing substance to decompose the adhesive material layer whereby the adhesive material layer is released from the support (Patent Literature 1), and a technique in which a heat fusible hydrocarbon series compound is used as an adhesive material, and bonding and delamination are carried out in a heat-molten state (Patent Literature 2). The former technique involved the problems that it requires an expensive tool such as laser, and a treatment time per one substrate is longer. The latter technique is simple because of control only by heat, but the applicable range is limited since thermal stability at high temperatures exceeding 200° C. is insufficient. Further, these temporary adhesive layers are not adequate to form a layer with uniform thickness on a heavily stepped substrate and to provide a complete adhesion to the support.

Also, it has been proposed to use a silicone adhesive agent as the temporary adhesive material layer (Patent Literature 3). This is to bond a substrate to a support using an addition curable type silicone adhesive agent, and on removal, the assembly is immersed in a chemical solution capable of dissolving or decomposing the silicone resin, whereby the substrate is separated from the support. Thus, this method takes a very long time for removal and is difficultly applicable to the actual manufacturing process.

CITATION LIST

Patent Literature

PATENT LITERATURE 1: JP 2004-64040A
PATENT LITERATURE 2: JP 2006-328104A
PATENT LITERATURE 3: U.S. Pat. No. 7,541,264

SUMMARY OF THE INVENTION

Technical Problem

The present invention has been accomplished in view of the above-mentioned circumstance, and an object thereof is to provide a wafer processing laminate, a wafer processing member, a temporary adhering material for processing a wafer, and a method for manufacturing a thin wafer using the same, which facilitate to establish a temporary adhering, enable to form a layer of uniform thickness on a heavily stepped substrate, are compatible with the TSV formation and wafer back surface interconnect forming steps, allow for easy removal, and can heighten productivity of the thin wafer.

Solution to Problem

The present invention has been done to solve the above-mentioned problems and provide a wafer processing laminate comprising a support, a temporary adhesive material layer formed thereon and a wafer laminated on the temporary adhesive material layer, where the wafer has a circuit-forming front surface and a back surface to be processed, wherein the temporary adhesive material layer comprises a three-layered structure complex temporary adhesive material layer comprising a first temporary adhesive layer of a thermoplastic organopolysiloxane polymer layer (A) releasably adhered on a surface of the wafer, a second temporary adhesive layer of a radiation curable polymer layer (B) laminated on the first temporary adhesive layer, and a third temporary adhesive layer of a thermoplastic organopolysiloxane polymer layer (A') laminated on the second temporary adhesive layer and releasably adherable to the support.

In the present invention, it is also provided a wafer processing member comprising a support, a temporary adhesive material layer formed thereon, where the wafer has a circuit-forming front surface and a back surface to be processed, and the wafer is temporarily adhered on the temporary adhesive material layer, wherein the temporary adhesive material layer comprises a third temporary adhesive layer of a thermoplastic organopolysiloxane polymer layer (A') releasably adhered to the support, a second temporary adhesive layer of a radiation curable polymer layer (B) laminated on the third temporary adhesive layer, and a first temporary adhesive layer of a thermoplastic organopolysiloxane polymer layer (A) laminated on the second temporary adhesive layer and releasably adherable to the front surface of the wafer.

Moreover, in the present invention, it is provided a temporary adhering material for processing a wafer which is a material for temporary adhering a wafer to a support, where the wafer has a circuit-forming front surface and a back surface to be processed, wherein the material comprises a first temporary adhesive layer of a thermoplastic organopolysiloxane polymer layer (A) releasably adherable to the front surface of the wafer, a second temporary adhesive layer of a radiation curable polymer layer (B) laminated on the first temporary adhesive layer, and a third temporary adhesive layer of a thermoplastic organopolysiloxane polymer layer (A') laminated on the second temporary adhesive layer and releasably adherable to the support.

Such a wafer processing laminate, a wafer processing member, and a temporary adhering material for processing a wafer are employed, they can facilitate to establish a temporary adhering of the wafer and the support, enable to form a layer of uniform thickness on a heavily stepped substrate, be compatible with the TSV formation and wafer back surface interconnect forming steps, allow for easy removal, and heighten productivity of the thin wafer.

Also, in these cases, it is preferred that the thermoplastic organopolysiloxane polymer layer (A) and the thermoplastic organopolysiloxane polymer layer (A') each are an unreactive organopolysiloxane layer containing 99.000 to 99.999 mol % of a siloxane unit (D unit) represented by $R^{11}R^{12}SiO_{2/2}$, 1.000 to 0.001 mol % of a siloxane unit (M unit) represented by $R^{13}R^{14}R^{15}SiO_{1/2}$, and 0.000 to 0.500 mol % of a siloxane unit (T unit) represented by $R^{16}SiO_{3/2}$, where $R^{11}$, $R^{12}$, $R^{13}$, $R^{14}$, $R^{15}$ and $R^{16}$ each represent an unsubstituted or substituted monovalent hydrocarbon group, having a weight average molecular weight of 200,000 to 1,000,000, and containing 0.5% by mass or less of a low molecular weight component having a molecular weight of 740 or less.

Such thermoplastic organopolysiloxane polymer layers (A) and (A') are preferred since they are excellent in adhesiveness and heat resistance.

Also, in these cases, it is preferred that the radiation curable polymer layer (B) is a cured product layer of a composition comprising 100 parts by mass of a radiation curable modified siloxane polymer which comprises an epoxy group-containing silicone polymer compound having a recurring unit represented by the following formula (1) and having a weight average molecular weight of 3,000 to 500,000, 0.1 to 50 parts by mass of one or more cross-linking agents selected from a compound having 2 or more phenolic hydroxyl groups on an average in one molecule, and a compound having 2 or more epoxy groups on an average in one molecule, and 0.05 to 20 parts by mass of a photoacid generator generating an acid by photoirradiation in the range of 240 nm to 500 nm.

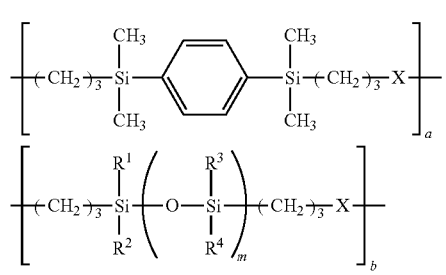

(1)

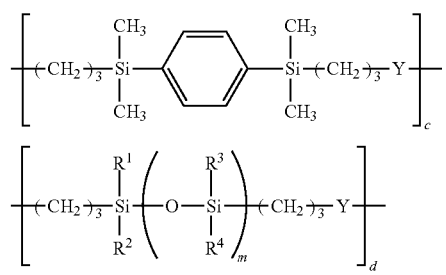

wherein $R^1$ to $R^4$ may be the same or different from each other and each represent a monovalent hydrocarbon group having 1 to 8 carbon atoms; "m" represents an integer of 1 to 100; "a", "b", "c" and "d" are each 0 or a positive number, and a+b+c+d=1, wherein "c" and "d" are not simultaneously 0; and 0<(c+d)/(a+b+c+d)≤1.0; and X represents a divalent organic group represented by the following formula (2); and Y represents a divalent organic group represented by the following formula (3),

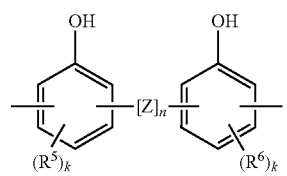

(2)

wherein Z represents a divalent organic group selected from the following,

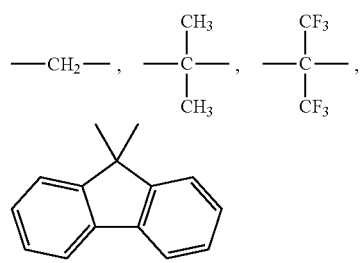

"n" represents 0 or 1; $R^5$ and $R^6$ each represent an alkyl group or an alkoxy group each having 1 to 4 carbon atoms and each may be the same or different from each other; and "k" represents 0, 1 or 2,

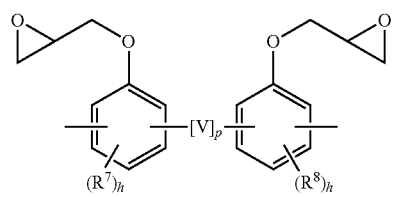

(3)

wherein V represents a divalent organic group selected from the following,

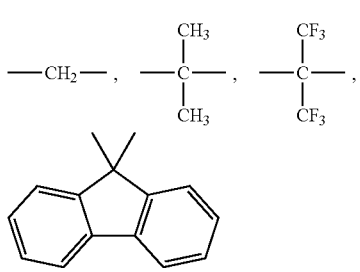

"p" represents 0 or 1; R⁷ and R⁸ each represent an alkyl group or an alkoxy group each having 1 to 4 carbon atoms and each may be the same or different from each other; and "h" represents 0, 1 or 2.

Such a radiation curable polymer layer (B) is preferably used since the product becomes more excellent in heat resistance and the resulting temporary adhesive layer becomes uniform in thickness. In addition, it can be cured by radiation. When it is compared with a cured layer obtained by general heat curing, it is preferred since shrinkage at the time of curing is extremely low so that a stress exerted to the wafer to be processed is extremely small whereby warpage of the wafer can be made small.

The present invention also provides a method for manufacturing a thin wafer, which comprises the steps of
(a) a step of bonding a wafer to a support via the temporary adhesive material layer, used for the wafer processing laminate of the present invention, the layer comprising the thermoplastic organopolysiloxane polymer layer (A), the radiation curable polymer layer (B), and the thermoplastic organopolysiloxane polymer layer (A'), where the wafer has a circuit-forming front surface and a non-circuit-forming back surface, with the circuit-forming surface being bonded to the support, and curing the radiation curable polymer layer (B) by radiation,
(b) a step of grinding or polishing the non-circuit-forming surface of the wafer bonded to the support,
(c) a step of processing the non-circuit-forming surface of the wafer, and
(d) a step of delaminating the processed wafer from the support.

According to such a method for manufacturing a thin wafer, by using the temporary adhesive material layer comprising three layers of the present invention for bonding of the wafer and the support, a thin wafer having a through electrode structure or a bump interconnect structure can be easily manufactured by using the temporary adhesive material layer.

In this case, the above-mentioned (d) step of delaminating the processed wafer from the support preferably contains
(e) a step of adhering a dicing tape to the wafer surface of the processed wafer,
(f) a step of subjecting a dicing tape surface to vacuum chucking to a chuck surface, and
(g) a step of delaminating the support from the processed wafer at a temperature of the chuck surface in a temperature range of 0° C. to 100° C.

According to the above delaminating step, the support can be easily released from the processed wafer, and the subsequent dicing step can be carried out easily.

In this case, it is preferred to carry out
(h) a step of removing the temporary adhesive material layer remained at the circuit-forming surface of the delaminated wafer, after (d) the step of delaminating the processed wafer from the support.

A part of the thermoplastic organopolysiloxane polymer layer (A) remains in some cases at the circuit-forming surface of the delaminated wafer from the support by Step (d). Removal of the thermoplastic organopolysiloxane polymer layer (A) can be carried out, for example, by cleaning the wafer with a hydrocarbon solvent such as pentane, hexane, cyclohexane, decane, isododecane, limonene, etc.

Advantageous Effects of Invention

The temporary adhesive material layer in the present invention can be applied to a wide range of semiconductor film forming process because of high heat resistance. An adhesive material layer having high uniformity in thickness can be formed even on a stepped wafer. By virtue of uniformity in thickness of the film, a uniform thin wafer having 50 μm or less can be easily manufactured. Moreover, after the thin wafer is manufactured, the wafer can be easily delaminated from the support at room temperature so that a fragile thin wafer can be easily manufactured.

BRIEF DESCRIPTION OF DRAWINGS

FIG. 1 is a cross-sectional view of a wafer processing laminate showing one of embodiments of the invention.

DESCRIPTION OF EMBODIMENTS

The present inventors have intensively studied to accomplish the above-mentioned objects, and as a result, they have found a method for manufacturing a thin wafer having a through electrode structure or a bump interconnect structure by using a temporary adhesive material layer which comprises three layers of a thermoplastic temporary adhesive layer comprising (A) a high polymerization degree organopolysiloxane, a radiation curable temporary adhesive layer comprising a layer containing (B) a modified siloxane polymer as a main component, and further, a thermoplastic temporary adhesive layer comprising (A') a high polymerization degree organopolysiloxane, for bonding of the wafer and the support.

The wafer processing laminate 10 of the present invention has, as shown in FIG. 1, a wafer 1 to be processed, a support 2 for carrying the wafer 1 during the processing of the wafer 1, and a temporary adhesive material layer 3 intervening between the wafer 1 and the support 2. The temporary adhesive material layer 3 comprises a three-layered structure of a thermoplastic organopolysiloxane polymer layer (A) (a first temporary adhesive layer), a radiation curable polymer layer (B) (a second temporary adhesive layer), and a thermoplastic organopolysiloxane polymer (A') (a third temporary adhesive layer), the first temporary adhesive layer is releasably adhered to the front surface of the wafer 1 to be processed, where the wafer 1 has a circuit-forming front surface and a back surface to be processed, and the third temporary adhesive layer is releasably adhered to the support 2.

Also, the wafer processing member of the present invention comprises a support 2, a thermoplastic organopolysiloxane polymer layer (A') laminated thereon, a radiation curable polymer layer (B) laminated thereon, and a thermoplastic organopolysiloxane polymer layer (A) laminated thereon, and a temporary adhesive material for processing wafer of the present invention comprises a laminated material of the above-mentioned polymer layers ((A), (B) and (A')).

In the following, the present invention will be explained in more detail.

<Temporary Adhesive Material Layer>

—First Temporary Adhesive Layer (A) and Third Temporary Adhesive Layer (A')/Thermoplastic Organopolysiloxane Polymer Layer—

The first temporary adhesive layer (A) and the third temporary adhesive layer (A') may be the same or different from each other, and may be mentioned a layer of an unreactive organopolysiloxane comprising 99.000 to 99.999 mol %, preferably 99.500 to 99.999 mol % of a siloxane unit (D unit) represented by $R^{11}R^{12}SiO_{2/2}$, 1.000 to 0.001 mol %, preferably 0.500 to 0.001 mol % of a siloxane unit (M unit) represented by $R^{13}R^{14}R^{15}SiO_{1/2}$, and 0.000 to 0.500 mol %, preferably 0.000 to 0.100 mol % of a siloxane unit (T unit) represented by $R^{16}SiO_{3/2}$, having a weight average molecular weight of 200,000 to 1,000,000, and containing 0.5% by mass or less of a low molecular weight component having a molecular weight of 740 or less.

In the above formulae, the organic substituents $R^{11}$, $R^{12}$, $R^{13}$, $R^{14}$, $R^{15}$ and $R^{16}$ each represent an unsubstituted or substituted monovalent hydrocarbon group having 1 to 10 carbon atoms, specifically a hydrocarbon group including an alkyl group such as a methyl group, an ethyl group, an n-propyl group, an isopropyl group, a n-butyl group, a t-butyl group, a n-pentyl group, a cyclopentyl group, a n-hexyl group, etc., a cycloalkyl group such as a cyclohexyl group, etc., an aryl group such as a phenyl group, a tolyl group, etc., and a group in which a part or whole of these hydrogen atoms of the above groups is/are substituted by a halogen atom(s), preferably a methyl group and a phenyl group.

A molecular weight of the above-mentioned organopolysiloxane is a value of a weight average molecular weight (in the present specification, "a weight average molecular weight" means this value.) obtained in accordance with a calibration curve prepared by using polystyrene standard substances by GPC (gel permeation chromatography), and the weight average molecular weight is 200,000 or more, more preferably 350,000 or more, and, 1,000,000 or less, more preferably 800,000 or less, and a content of a low molecular weight component having a molecular weight of 740 or less is 0.5% by mass or less, more preferably 0.1% by mass or less.

In the above-mentioned organopolysiloxane, if the weight average molecular weight is 200,000 or more, it is preferred since it can sufficiently withstand to the grinding step for thinning the wafer. On the other hand, if the weight average molecular weight is 1,000,000 or less, it is preferred since it can be cleaned at the cleaning step after completion of the steps.

On the other hand, if the content of the low molecular weight component having a molecular weight of 740 or less is 0.5% by mass or less, it is preferred since sufficient heat resistance can be obtained to withstand the heat treatment during formation of a through electrode or the heat treatment of bump electrodes formed on the wafer back surface.

Further, D unit preferably constitutes 99.000 to 99.999 mol % of the resin. If the content thereof is 99.000 mol % or more, it is preferred since the resin can withstand the grinding step for thinning the wafer, while if it is 99.999 mol % or less, it is also preferred since there is no fear that the wafer cannot be delaminated from the temporary adhesive layer (B) after completion of the steps.

M units are added to seal the active group at the ends of the resin mainly comprising D units and used for adjusting the molecular weight thereof.

The thermoplastic organopolysiloxane layer may be preformed as a film, and the film may be used by laminating to the wafer using a roll laminator, etc. Alternatively, a solution thereof may be coated on the wafer by the method such as spin coating, roll coating, etc., to form a film and used. When the layers (A) and (A') are formed on the wafer by the method of spin coating, etc., it is preferred to coat the resin as a solution and then dry the same. In this case, a hydrocarbon solvent such as pentane, hexane, cyclohexane, decane, isododecane, limonene, etc., is preferably used. To the thermoplastic organopolysiloxane polymer solution may be added a conventionally known antioxidant for the purpose of improving heat resistance. The layers (A) and (A') are each preferably formed with a film thickness between 0.1 and 10 μm and used. If it is 0.1 μm or more, it can cover steps on the device wafer, while if it is 10 μm or less, it can sufficiently withstand the grinding step in the manufacture of a thin wafer so that the above range is preferred. To the thermoplastic siloxane may be added 50 parts by mass or less of a filler such as silica based on 100 parts by mass of the thermoplastic organopolysiloxane to further heighten heat resistance.

—Second Temporary Adhesive Layer (B)/Radiation Curable Modified Siloxane Polymer Layer—

The second temporary adhesive layer (B) may be mentioned a layer of a cured product of a radiation curable composition comprising a radiation curable modified siloxane polymer represented by the formula (1) as a main component. The composition can be cured by radiation, and as compared with a cured layer obtained by general heat curing, shrinkage at the time of curing is extremely low so that a stress exerted to the wafer to be processed is extremely small whereby warpage of the wafer can be made small.

Polymer of the Formula (1):

It is an epoxy group-containing silicone polymer compound having a recurring unit represented by the following formula (1) and having a weight average molecular weight of 3,000 to 500,000.

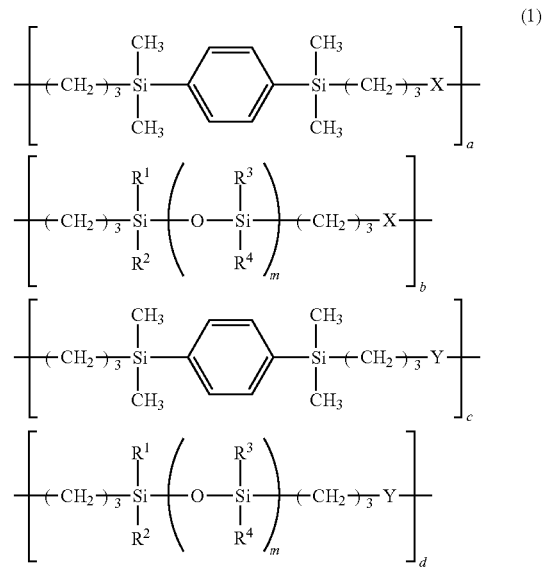

wherein $R^1$ to $R^4$ may be the same or different from each other and each represent a monovalent hydrocarbon group having 1 to 8 carbon atoms; "m" represents an integer of 1 to 100; "a", "b", "c" and "d" are each 0 or a positive number, and a+b+c+d=1, wherein "c" and "d" are not simultaneously 0; and $0<(c+d)/(a+b+c+d)\le 1.0$; and X represents a divalent organic group represented by the following formula (2); and Y represents a divalent organic group represented by the following formula (3),

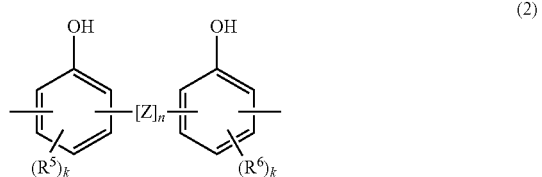
(2)

wherein Z represents a divalent organic group selected from the following,

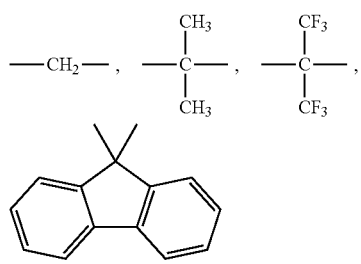

"n" represents 0 or 1; $R^5$ and $R^6$ each represent an alkyl group or an alkoxy group each having 1 to 4 carbon atoms and each may be the same or different from each other; and "k" represents 0, 1 or 2,

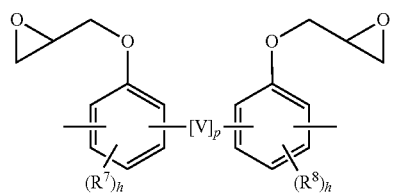
(3)

wherein V represents a divalent organic group selected from the following,

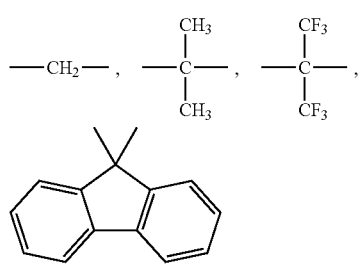

"p" represents 0 or 1; $R^7$ and $R^8$ each represent an alkyl group or an alkoxy group each having 1 to 4 carbon atoms and each may be the same or different from each other; and "h" represents 0, 1 or 2.

The radiation curable composition mainly comprising the radiation curable modified siloxane polymer of the above-mentioned formula (1) contains one or more cross-linking agent selected from a compound having 2 or more phenolic hydroxyl groups on an average in one molecule, and a compound having 2 or more epoxy groups on an average in one molecule for its radiation curing.

In particular, it may contain a di-functional, tri-functional, tetra-functional or more polyfunctional cross-linking agent, particularly an epoxy resin, for example, EOCN-1020, EOCN-102S, XD-1000, NC-2000-L, EPPN-201, GAN, NC6000 all products of NIPPON KAYAKU Co., Ltd., or a cross-linking agent represented by the following formula.

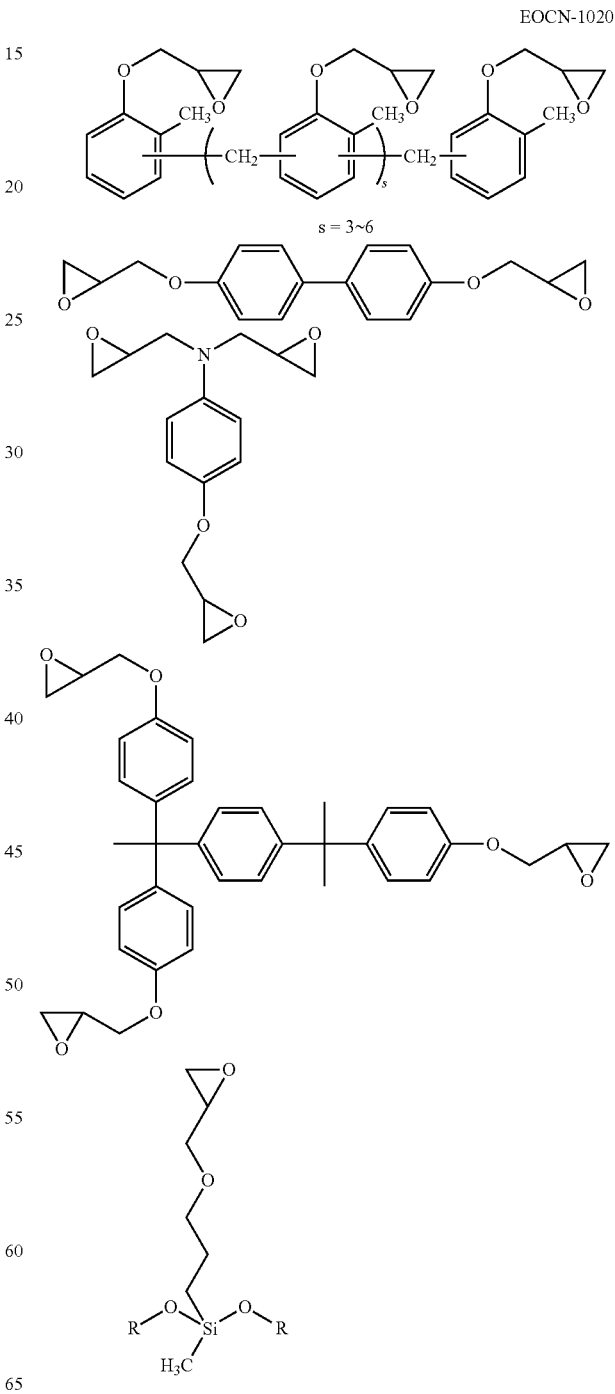

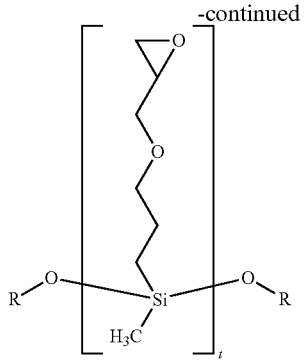

R = methyl group or ethyl group
t = 1 20%
t = 2 75%
t ≥ 3 5%

A formulation amount of the cross-linking agent is 0.1 to 50 parts by mass, preferably 0.1 to 30 parts by mass, further preferably 1 to 20 parts by mass based on 100 parts by mass of the above-mentioned radiation curable modified siloxane polymer, and the agent may be used in admixture of two kinds or three or more kinds in combination.

The radiation curable composition mainly comprising the radiation curable modified siloxane polymer of the above-mentioned formula (1) contains a photoacid generator for curing itself by radiation. The photoacid generator may be mentioned, for example, those which generate an acid by photoirradiation of a wavelength of 240 nm to 500 nm, and become a curing catalyst. The radiation curable modified siloxane polymer of the present invention has excellent compatibility with an photoacid generator, so that various photoacid generators can be used. Such an photoacid generator may be mentioned, for example, an onium salt, a diazomethane derivative, a glyoxime derivative, a β-ketosulfone derivative, a disulfone derivative, a nitrobenzylsulfonate derivative, a sulfonic acid ester derivative, an imidoyl-sulfonate derivative, an oxime sulfonate derivative, an iminosulfonate derivative, a triazine derivative, etc.

The above-mentioned onium salt may be mentioned, for example, the compound represented by the following formula (4).

$$(R^{4'})_{h'}M^+K^- \qquad (4)$$

wherein $R^{4'}$ represents a linear, branched or cyclic alkyl group having 1 to 12 carbon atoms which may have a substituent(s), an aryl group having 6 to 12 carbon atoms or an aralkyl group having 7 to 12 carbon atoms, $M^+$ represents an iodonium or a sulfonium, $K^-$ represents a non-nucleophilic counter ion, and h' represents 2 or 3.

In the above-mentioned $R^{4'}$, the alkyl group may be mentioned, for example, a methyl group, an ethyl group, a propyl group, a butyl group, a cyclohexyl group, a 2-oxocyclohexyl group, a norbornyl group, an adamantyl group, etc. Also, the aryl group may be mentioned, for example, an alkoxyphenyl group such as o-, m- or p-methoxyphenyl, ethoxyphenyl, m- or p-tert-butoxyphenyl, etc.; and an alkylphenyl group such as 2-, 3- or 4-methylphenyl, ethylphenyl, 4-tert-butylphenyl, 4-butylphenyl, dimethylphenyl, etc. Further, the aralkyl group may be mentioned, for example, each group of benzyl, phenethyl, etc.

The non-nucleophilic counter ion of $K^-$ may be mentioned a halide ion such as a chloride ion, a bromide ion, etc.; a fluoroalkylsulfonate such as triflate, 1,1,1-trifluoroethanesulfonate, nonafluorobutanesulfonate, etc.; an arylsulfonate such as tosylate, benzenesulfonate, 4-fluorobenzenesulfonate, 1,2,3,4,5-pentafluorobenzene-sulfonate, etc.; an alkylsulfonate such as mesylate, butanesulfonate, etc.; and a hexafluorophosphate ion, a fluorinated alkylfluorophosphate ion, etc.

The diazomethane derivatives may be mentioned the compound represented by the following formula (5),

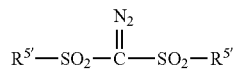

(5)

wherein $R^{5'}$'s may be the same or different from each other, and each represent a linear, branched or cyclic alkyl group or a halogenated alkyl group each having 1 to 12 carbon atoms, an aryl group or a halogenated aryl group each having 6 to 12 carbon atoms, or an aralkyl group having 7 to 12 carbon atoms.

In the above-mentioned $R^{5'}$, the alkyl group may be mentioned, for example, a methyl group, an ethyl group, a propyl group, a butyl group, an amyl group, a cyclopentyl group, a cyclohexyl group, a norbornyl group, an adamantyl group, etc.

Also, the halogenated alkyl group may be mentioned, for example, trifluoromethyl, 1,1,1-trifluoroethyl, 1,1,1-trichloroethyl, nonafluorobutyl, etc. The aryl group may be mentioned, for example, phenyl; an alkoxyphenyl group such as o-, m- or p-methoxyphenyl, ethoxyphenyl, m- or p-tert-butoxyphenyl, etc.; an alkylphenyl group such as 2-, 3- or 4-methylphenyl, ethylphenyl, 4-tert-butylphenyl, 4-butylphenyl, dimethylphenyl, etc. The halogenated aryl group may be mentioned, for example, fluorobenzene, chlorobenzene, 1,2,3,4,5-pentafluorobenzene, etc. The aralkyl group may be mentioned, for example, a benzyl group, a phenethyl group, etc.

The glyoxime derivatives may be mentioned the compound represented by the following formula (6),

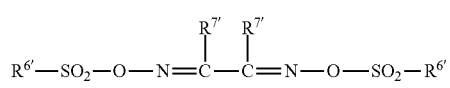

(6)

wherein $R^{6'}$ and $R^{7'}$ may be the same or different from each other and each represent a linear, branched or cyclic alkyl group or a halogenated alkyl group each having 1 to 12 carbon atoms, an aryl group or a halogenated aryl group each having 6 to 12 carbon atoms, or an aralkyl group having 7 to 12 carbon atoms; and $R^{7'}$s may be bonded to each other to form a cyclic structure, and when the cyclic structure is formed, $R^{7'}$ represents a linear or branched alkylene group having 1 to 6 carbon atoms.

The alkyl group, the halogenated alkyl group, the aryl group, the halogenated aryl group and the aralkyl group of the above-mentioned $R^{6'}$ and $R^{7'}$ may be mentioned those exemplified in the above-mentioned $R^{5'}$. The alkylene group of the above-mentioned $R^{7'}$ may be mentioned a methylene group, an ethylene group, a propylene group, a butylene group, a hexylene group, etc.

The photoacid generator may be specifically mentioned, for example, an onium salt such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxy-phenyl)sulfonium trifluoromethanesulfonate, triphenylsulfonium p-toluenesulfonate, (p-tert-butoxyphenyl)-diphenylsulfonium p-toluenesulfonate, bis(p-tert-butoxy-phenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)-sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, bis(4-tert-butylphenyl)iodonium hexafluorophosphate, diphenyl(4-thiophenoxyphenyl)sulfonium hexafluoroantimonate, etc.;

a diazomethane derivative such as bis(benzene-sulfonyl)diazomethane, bis(p-toluenesulfonyl)diazomethane, bis(xylenesulfonyl)diazomethane, bis(cyclohexylsulfonyl)-diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propyl-sulfonyl)diazomethane, bis(isopropylsulfonyl)diazomethane, bis(tert-butylsulfonyl)diazomethane, bis(n-amylsulfonyl)-diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane and 1-tert-amylsulfonyl-1-(tert-butylsulfonyl)-diazomethane, etc.;

a glyoxime derivative such as bis-o-(p-toluene-sulfonyl)-α-dimethylglyoxime, bis-o-(p-toluenesulfonyl)-α-diphenylglyoxime, bis-o-(p-toluenesulfonyl)-α-dicyclohexylglyoxime, bis-o-(p-toluenesulfonyl)-2,3-pentadione glyoxime, bis-(p-toluenesulfonyl)-2-methyl-3,4-pentadione glyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylglyoxime, bis-o-(n-butanesulfonyl)-2,3-pentadione glyoxime, bis-o-(n-butanesulfonyl)-2-methyl-3,4-pentadione glyoxime, bis-o-(methanesulfonyl)-α-dimethylglyoxime, bis-o-(trifluoromethanesulfonyl)-α-dimethylglyoxime, bis-o-(1,1,1-trifluoroethanesulfonyl)-α-dimethylglyoxime, bis-o-(tert-butanesulfonyl)-α-dimethylglyoxime, bis-o-(perfluorooctanesulfonyl)-α-dimethylglyoxime, bis-o-(cyclohexanesulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimethylglyoxime, bis-o-(xylene-sulfonyl)-α-dimethylglyoxime, bis-o-(camphorsulfonyl)-α-dimethylglyoxime, etc.;

an oxime sulfonate derivative such as α-(benzene-sulfoniumoxyimino)-4-methylphenylacetonitrile, etc.; a β-ketosulfone derivative such as 2-cyclohexylcarbonyl-2-(p-toluenesulfonyl)propane and 2-isopropylcarbonyl-2-(p-toluenesulfonyl)propane, etc.;

a disulfone derivative such as diphenyldisulfone, dicyclohexyldisulfone, etc.; a nitrobenzylsulfonate derivative such as 2,6-dinitrobenzyl p-toluenesulfonate, 2,4-dinitrobenzyl p-toluenesulfonate, etc.;

a sulfonic acid ester derivative such as 1,2,3-tris(methanesulfonyloxy)benzene, 1,2,3-tris(trifluoro-methanesulfonyloxy)benzene, 1,2,3-tris(p-toluenesulfonyl-oxy)benzene, etc.; and an imide-yl-sulfonate derivative such as phthalimide-yl-triflate, phthalimide-yl-tosylate, 5-norbornene 2,3-dicarboxylmide-yl-triflate, 5-norbornene 2,3-dicarboxylmide-yl-tosylate, 5-norbornene 2,3-dicarboxylmide-yl-n-butylsulfonate, n-trifluoromethylsulfonyloxynaphthylimide, etc.

Moreover, there may be mentioned an iminosulfonate such as (5-(4-methylphenyl)sulfonyloxyimino-5H-thiophene-2-ylidene)-(2-methylphenyl)acetonitrile, (5-(4-(4-methyl-phenylsulfonyloxy)phenylsulfonyloxyimino)-5H-thiophene-2-ylidene)-(2-methylphenyl)-acetonitrile, etc. Among these, an imide-yl sulfonate, an iminosulfonate, and an oxime sulfonate can be suitably used.

The above-mentioned photoacid generator may be used a single kind alone or in admixture of two or more kinds in combination. A formulation amount of the photoacid generator is preferably 0.05 to 20 parts by mass, particularly preferably 0.2 to 5 parts by mass based on 100 parts by mass of the above-mentioned radiation curable modified siloxane polymer. If the formulation amount is 0.05 parts by mass or more, sufficient radiation-sensitive curability can be obtained, while if it is 20 parts by mass or less, there is no fear to worsen curability with a thick film due to light absorption of the photoacid generator itself.

On the other hand, this composition may be in a film, and may be formed on either of the layer (A) formed on the wafer, or the layer (A') formed on the support. Also, the layer of the composition may be formed by dissolving the composition in a solution, and coating on the layer (A) or on the layer (A') specifically by the method such as spin coating, roll coating, die coating, etc. The solution to be used for dissolution in that case may be mentioned, for example, a ketone such as cyclohexanone, cyclopentanone, methyl-2-n-amyl ketone, etc.; an alcohol such as 3-methoxybutanol, 3-methyl-3-methoxybutanol, 1-methoxy-2-propanol, 1-ethoxy-2-propanol, etc.; an ether such as propylene glycol monomethyl ether, ethylene glycol monomethyl ether, propylene glycol monoethyl ether, ethylene glycol monoethyl ether, propylene glycol dimethyl ether, diethylene glycol dimethyl ether, etc.; an ester such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, etc., and these may be used a single kind alone or in admixture of two or more kinds in combination.

Incidentally, a conventionally known antioxidant, or a filler such as silica may be added to the composition to further heighten heat resistance in an amount of 50 parts by mass or less.

The second temporary adhesive layer (B) preferably has a thickness at the time of curing of 10 to 200 µm, more preferably to form a film with 20 to 120 µm. If the thickness is 10 µm or more, it can sufficiently endure the grinding step of thinning the wafer, while if it is 200 µm or less, there is no fear of generating resin deformation in the heat treatment step such as TSV formation step, etc., and it can endure for practical use whereby it is preferred.

<Manufacturing Method of Thin Wafer>

The manufacturing method of a thin wafer of the present invention is characterized in that it uses the temporary adhesive material layer comprising three layers of the above-mentioned (A), (B) and (A') as an adhesive layer of the wafer having a semiconductor circuit, etc., and the support. A thickness of the thin wafer obtained according to the manufacturing method of the present invention is typically 5 to 300 μm, more typically 10 to 100 μm.

The manufacturing method of a thin wafer of the present invention comprises the steps of (a) to (d).

(a) A step of bonding a wafer to a support via a temporary adhesive material layer, used for the wafer processing laminate of the present invention, the layer comprising the thermoplastic organopolysiloxane polymer layer (A), the radiation curable polymer layer (B), and the thermoplastic organopolysiloxane polymer layer (A'), where the wafer has a circuit-forming front surface and a non-circuit-forming back surface, with the circuit-forming surface being bonded to the support, and curing the radiation curable polymer layer (B) by radiation, (b) a step of grinding or polishing the non-circuit-forming surface of the wafer bonded to the support, (c) a step of processing the non-circuit-forming surface of the wafer, and (d) a step of delaminating the processed wafer from the support.

The above-mentioned (d) step of delaminating the processed wafer from the support is preferably carried out by (e) a step of adhering a dicing tape to the wafer surface of the processed wafer, (f) a step of subjecting a dicing tape surface to vacuum chucking to a chuck surface, and (g) a step of delaminating the support from the processed wafer at a temperature of the chuck surface in a temperature range of 0° C. to 100° C.

It is preferred to carry out (h) a step of removing the temporary adhesive material layer remained at the circuit-forming surface of the delaminated wafer is carried out after the above-mentioned (d) step of delaminating the processed wafer from the support.

[Step (a)]

Step (a) is a step of bonding a circuit-forming surface of a wafer having the circuit-forming front surface and a non-circuit-forming back surface to a support via a temporary adhesive material layer comprising three layers of the above-mentioned temporary adhesive layers (A), (B) and (A'). The wafer having the circuit-forming surface and the non-circuit-forming surface is a wafer one of the surfaces of which is a circuit-forming surface, and the other surface of which is a non-circuit-forming surface. The wafer to which the present invention can be applied is generally a semiconductor wafer. Examples of the semiconductor wafer may be mentioned not only a silicon wafer, but also a germanium wafer, a gallium-arsenic wafer, a gallium-phosphorus wafer, a gallium-arsenic-aluminum wafer, etc. A thickness of the wafer is not particularly limited, and it is generally 500 to 1000 μm, typically 600 to 800 μm, more typically 625 to 775 μm.

The support which can be used may be mentioned a substrate of glass, quartz wafer, etc., and light transmittance of the support is required.

The above-mentioned temporary adhesive layers (A), (B) and (A') may be each formed as films to the wafer or the support, or may be each formed by coating each solution to the wafer or the support by the method such as spin coating, etc. In this case, after spin coating, the solution is prebaked at a temperature of 80 to 200° C. depending on the volatile conditions of the used solvent, and then applied to use. Moreover, it is also possible that the temporary adhesive layers (A), (B) and (A') in film form may be previously united together into a layer arrangement, which are adhered to each other, and it can be applied to bonding by making the layer (A) to the wafer side, and the layer (A') to the support side.

The wafer and the support to which the above-mentioned temporary adhesive layers (A), (B) and (A') had been formed can be formed as a bonded substrate through the temporary adhesive layers (A), (B) and (A'). At this time, a wafer processing laminate (laminated substrate) in which the wafer had been bonded to the support can be formed by uniformly crimping the substrate at a temperature region preferably at 40 to 230° C., more preferably at 40 to 200° C. under reduced pressure at the temperature.

A wafer bonding apparatus may be mentioned a commercially available wafer bonding apparatus, for example, EVG520IS and 850TB from EVG, and XBC300 from SUSS, etc.

After the wafer processing laminate (laminated substrate) is formed, the radiation curable modified siloxane polymer layer (B) is exposed to light having a wavelength of 240 nm to 500 nm from the support side having light transmitting property, and if further necessary, by heating after the exposure to cure the polymer.

As the light with the above-mentioned wavelength of 240 to 500 nm, there may be mentioned, for example, light with various wavelengths generated by radiation generating apparatuses, for example, ultraviolet rays such as g line, i line, etc., far ultraviolet rays (248 nm), etc. An exposure value is preferably, for example, 10 to 2000 mJ/cm$^2$. Here, a heat treatment may be carried out after the exposure, if necessary, to further heighten curing degree. The above heat treatment after the exposure may be carried out, for example, at 40 to 150° C. for 0.5 to 120 minutes.

[Step (b)]

Step (b) is a step to grind the non-circuit-forming surface of the wafer bonded to the support, that is, a step to reduce the thickness of the wafer by grinding the wafer back surface side of the wafer processing laminate obtained by bonding in Step (a). The technique of the grinding process of the wafer back surface is not particularly limited, and conventionally known grinding techniques may be used. Grinding is preferably carried out by feeding water to the wafer and a grinding wheel (diamond, etc.) for cooling. The apparatus for grinding the wafer back surface may be mentioned, for example, DAG-810 (trade name) by DISCO Co., Ltd.

[Step (c)]

Step (c) is for processing the non-circuit-forming surface of the wafer processing laminate which has been ground, i.e., the non-circuit-forming surface of the wafer processing laminate which has been thinned by grinding the back surface. This step includes various processes which can be applied on the wafer level. Examples of which may be mentioned electrode formation, metal wiring formation and protective film formation, etc. More specifically, any conventionally known processes may be mentioned, including metal sputtering for forming electrodes, etc., wet etching for etching a sputtered metal layer, formation of a pattern by coating of a resist to be used as a mask of metal wiring formation, exposure, and development, delamination of the resist, dry etching, formation of metal plating, silicon etching for TSV formation, formation of oxide film on the silicon front surface, etc.

[Step (d)]

Step (d) is a step of delaminating the wafer which has been processed in Step (c) from the wafer processing laminate.

That is, this is a step of delaminating the wafer from the wafer processing laminate after subjecting to various processing to the thinned wafer before dicing, and the wafer is delaminated at the interface between the adhesive layer (A) and the wafer. Suitable release method may be mentioned a method in which the wafer and the support are mainly heated (preferably 200 to 250° C.) and sliding them in horizontally opposite directions to separate them, a method in which one of the wafer or the support of the wafer processing laminate is horizontally fixed, and the other is pulled up at a certain angle relative to the horizontal direction, and a method in which a protective film is adhered onto the ground surface of the ground wafer, and the wafer and the protective film are released from the wafer processing laminate together by a delaminating procedure, etc.

To the present invention, any of these delaminating methods can be applied, and a method in which one of the wafer or the support of the wafer processing laminate is horizontally fixed, and the other is pulled up at a certain angle relative to the horizontal direction, and a method in which a protective film is adhered onto the ground surface of the ground wafer, and the wafer and the protective film are delaminated from the wafer processing laminate together by an exfoliating procedure, etc., are more suitable. These delaminating methods are generally carried out at room temperature.

Also, (d) the step of delaminating the processed wafer from the support preferably contains
(e) a step of adhering a dicing tape to the wafer surface of the processed wafer,
(f) a step of subjecting a dicing tape surface to vacuum chucking to a chuck surface, and
(g) a step of delaminating the support from the processed wafer at a temperature of the chuck surface in a temperature range of 0° C. to 100° C.

By employing these steps, the support can be easily released from the processed wafer, and the subsequent dicing step can be carried out easily.

The dicing tape to be used in the above-mentioned step (e) may be mentioned the conventionally known dicing tape in which an adhesive layer is formed on a substrate film. The substrate film may be specifically mentioned a flexible film comprising any of a low density polyethylene (LDPE), a linear low density polyethylene (LLDPE), an ethylene-propylene copolymer, polypropylene (non-stretched), poly-butene, polybutadiene, polymethylpentene, an ethylene-vinyl acetate copolymer, an ethylene-(meth)acrylic acid copolymer, an ethylene-methyl (meth)acrylate copolymer, an ethylene-ethyl (meth)acrylate copolymer, polyvinyl chloride, a vinyl chloride.vinyl acetate copolymer, an ethylene.vinyl chloride.vinyl acetate copolymer, polyurethane, polyamide, ionomer, or styrene-butadiene rubber, and a hydrogenated product thereof, or a modified product thereof, etc.

Also, as the adhesive layer, a pressure-sensitive adhesive layer of a rubber type, an acrylic type, a silicone type or a polyvinyl ether type, or an energy ray curable type or a heat-foamable type adhesive layer may be formed.

Further, the substrate film side of the dicing tape is vacuum adsorbed to a fixed plate such as an adsorbing plate, for example, a chack table, etc., and the wafer surface is delaminated from the support side while heating the adsorbed surface to 10 to 100° C., if necessary.

[Step (h)]

Step (h) is a step of removing the first temporary adhesive layer (A) if a part thereof is remained at the circuit-forming surface of the delaminated wafer. According to Step (d), there is a case where a part of the temporary adhesive layer (A) is remained at the circuit-forming surface of the wafer delaminated from the support, and removal of the first temporary adhesive layer (A) can be carried out, for example, by cleaning the wafer.

In Step (h), any cleaning solution which can dissolve the thermoplastic organopolysiloxane which constitutes the layer (A) in the temporary adhesive material layers can be used, and specifically mentioned pentane, hexane, cyclohexane, decane, isododecane, limonene, etc. These solvents may be used one kind alone, or in admixture of two or more kinds in combination. When it is difficultly removable, a base or an acid may be added to the above-mentioned solvents. Examples of the usable bases may be mentioned an amine such as ethanolamine, diethanolamine, triethanolamine, triethylamine, ammonia, etc., and an ammonium salt such as tetramethyl ammonium hydroxide, etc. The acids which can be used may include an organic acid such as acetic acid, oxalic acid, benzenesulfonic acid, dodecylbenzenesulfonic acid, etc. An amount thereof to be added is 0.01 to 10% by mass, preferably 0.1 to 5% by mass with a concentration in the cleaning solution. In addition, an already existing surfactant may be added thereto to improve removability of the remained material. The cleaning method may be mentioned a method in which cleaning is carried out in a paddle by using the above-mentioned solution, a method by spraying, or a method in which an object is dipped in a cleaning liquid tank. A temperature at that time is suitably 10 to 80° C., preferably 15 to 65° C. It is possible, after dissolving the layer (A) by these dissolving solutions, cleaning with water or rinsing with an alcohol is finally carried out and drying treatment is carried out to obtain a thin wafer, if necessary.

EXAMPLES

In the following, the present invention is specifically explained by referring to Examples and Comparative Example, but the present invention is not limited by the following mentioned Examples.

Resin Synthesis Example 1

In a four-necked flask were charged 1,000 g (3.38 mol) of octamethylcyclotetrasiloxane and 0.24 g (0.0015 mol) of hexamethyldisiloxane, and a temperature of the mixture was maintained at 110° C. Then, 4 g of 10% by mass tetrabutyl phosphonium hydroxide siliconate was added to the mixture, and polymerization was carried out for 4 hours. The mixture was further subjected to post-treatment at 160° C. for 2 hours to obtain dimethylpolysiloxane.

The obtained dimethylpolysiloxane was analyzed by $^{29}$Si-NMR method to determine the ratio of D unit and M unit. It was identified to be a dimethylpolysiloxane having the following structure comprising 99.978% of D unit and 0.022% of M unit with a polymerization degree of about 9,000.

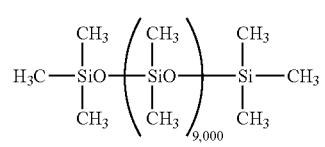

In 500 g of hexane was dissolved 500 g of the dimethylpolysiloxane, then, the solution was poured into 2 L of acetone, and the precipitated resin was recovered. Subsequently, hexane, etc., were removed in vacuum to obtain a dimethylpolysiloxane polymer having a weight average molecular weight of 700,000, and containing 0.05% by mass of a low molecular weight component having a molecular weight of 740 or less. In 80 g of isododecane was dissolved 20 g of the polymer, and the solution was filtered through a membrane filter of 0.2 μm to obtain an isododecane solution (A-1) of a dimethylpolysiloxane polymer.

Resin Synthesis Example 2

In a four-necked flask were charged 1,000 g (3.38 mol) of octamethylcyclotetrasiloxane and 0.93 g (0.003 mol) of tris(trimethylsiloxy)methylsilane, and a temperature of the mixture was maintained at 110° C. Then, 4 g of 10% by mass tetrabutyl phosphonium hydroxide siliconate was added to the mixture, and polymerization was carried out for 4 hours. The mixture was further subjected to post-treatment at 160° C. for 2 hours to obtain dimethylpolysiloxane.

The obtained dimethylpolysiloxane was analyzed by $^{29}$Si-NMR method to determine the ratio of D unit, M unit and T unit. It was identified to be a branched dimethylpolysiloxane having the following structure comprising 99.911% of D unit, 0.067% of M unit and 0.022% of T unit.

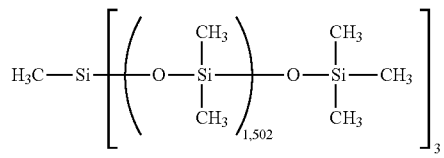

In 500 g of hexane was dissolved 500 g of the branched dimethylpolysiloxane, then, the solution was poured into 2 L of acetone, and the precipitated resin was recovered. Subsequently, hexane, etc., were removed in vacuum to obtain a dimethylpolysiloxane polymer having a weight average molecular weight of 400,000, and containing 0.07% by mass of a low molecular weight component having a molecular weight of 740 or less. In 80 g of isododecane was dissolved 20 g of the polymer, and the solution was filtered through a membrane filter of 0.2 μm to obtain an isododecane solution (A-2) of a dimethylpolysiloxane polymer.

Resin Synthesis Example 3

In a flask equipped with a stirrer, a thermometer, a device for replacing with nitrogen and a reflux condenser, 220.5 g of Compound (M-1) and 225.0 g Compound (M-2) were dissolved in 1,875 g of toluene, then, 949.6 g of Compound (M-3) and 6.1 g of Compound (M-4) were added to the mixture, and the resulting mixture was heated to 60° C. Thereafter, 2.2 g of a platinum catalyst carried on carbon (5% by mass) was charged therein, and after confirming the reaction temperature in the flask to be raised to 65° C. to 67° C., the mixture was further heated to 90° C. for 3 hours. Then, the mixture was cooled again to 60° C., 2.2 g of a platinum catalyst carried on carbon (5% by mass) was charged to the mixture, and 107.3 g of Compound (M-5) was added dropwise to the mixture over one hour. At this time, the temperature in the flask was increased to 80° C. After completion of the dropwise addition, the mixture was further matured at 90° C. for 3 hours, and cooled to room temperature. Then, 1,700 g of methyl isobutyl ketone (MIBK) was added to the mixture, and the present reaction solution was filtered through a filter under pressure to remove the platinum catalyst. Further, 760 g of pure water was added to the obtained polymer compound solution, the mixture was stirred and allowed to stand to separate the mixture, and the aqueous layer which was an under layer was removed. This operation of separating liquids and cleaning was repeated six times to remove a minor amount of the acid component in the resin solution. The solvent in the resin solution was removed under reduced pressure and then 950 g of cyclopentanone was added to the residue to obtain a resin solution comprising cyclopentanone as a main solvent with a concentration of the solid component of 60% by mass. When the molecular weight of the polymer compound in the polymer compound solution was measured by GPC, the weight average molecular weight was 75,000 in terms of a polystyrene, and in the formula (1), a=0.30, b=0.20, c=0.30 and d=0.20. Further, to 100 g of the resin solution were added 10 g of a cresol-novolac epoxy product (EOCN1020-55 product of NIPPON KAYAKU Co., Ltd.), and 0.3 g of a photoacid generator (IRGACURE PAG121 product of Ciba Japan, 2-[2-(4-methylphenylsulfonyloxyimino)-2,3-dihydrothiophene-3-ylidene]-2-(2-methylphenyl)acetonitrile), and the mixture was filtered through a 0.2 μm membrane filter to obtain a resin solution (B-1).

Resin Synthesis Example 4

In a 5 L flask equipped with a stirrer, a thermometer, a device for replacing with nitrogen and a reflux condenser, 396.9 g of Compound (M-1) and 45.0 g Compound (M-2) were dissolved in 1,875 g of toluene, then, 949.6 g of Compound (M-3) and 6.1 g of Compound (M-4) were added to the mixture, and the resulting mixture was heated to 60° C. Thereafter, 2.2 g of a platinum catalyst carried on carbon (5% by mass) was charged therein, and after confirming the reaction temperature in the flask to be raised to 65° C. to 67° C., the mixture was further heated to 90° C. for 3 hours. Then, the mixture was cooled again to 60° C., 2.2 g of a platinum catalyst carried on carbon (5% by mass) was charged to the mixture, and 107.3 g of Compound (M-5) was added dropwise to the mixture over one hour. At this time, the temperature in the flask was increased to 78° C. After completion of the dropwise addition, the mixture was further matured at 90° C. for 3 hours, and cooled to room temperature. Then, 1,700 g of methyl isobutyl ketone (MIBK) was added to the mixture, and the present reaction solution was filtered through a filter under pressure to remove the platinum catalyst. Further, 760 g of pure water was added to the obtained polymer compound solution, the mixture was stirred and allowed to stand to separate the mixture, and the aqueous layer which was an under layer was removed. This operation of separating liquids and cleaning was repeated six times to remove a minor amount of the acid component in the resin solution. The solvent in the resin solution was removed under reduced pressure and then 950 g of cyclopentanone was added to the residue to obtain a resin solution comprising cyclopentanone as a main solvent with a concentration of the solid component of 60% by mass. When the molecular weight of the resin in the resin solution was measured by GPC, the weight average molecular weight was 62,000 in terms of a polystyrene, and in the formula (1), a=0.54, b=0.36, c=0.06 and d=0.04. Further, to 100 g of the resin solution were added 15 g of a cresol-novolac epoxy product (EOCN1020-55 product of NIPPON KAYAKU Co., Ltd.), and 0.5 g of a photoacid generator (IRGACURE PAG121 product of Ciba Japan, 2-[2-(4-methylphenylsulfonyloxyimino)-2,3-dihydrothiophene-3-ylidene]-2-(2-methylphenyl)acetonitrile), and the mixture was filtered through a 0.2 μm membrane filter to obtain a resin solution (B-2).

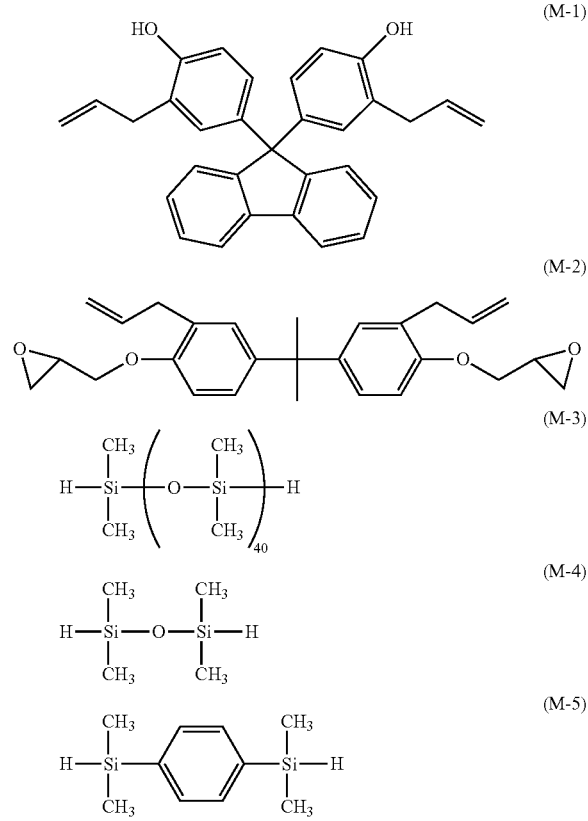

Resin Film Preparation Example 1

The resin solution (A-1) prepared in Resin synthesis example 1 were coated on a PET (polyethylene terephthalate) film with a thickness of 38 μm by using a blade knife, and then, heated in a dryer at 100° C. for 30 minutes to form a film having a thermoplastic polyorganosiloxane layer with a thickness of 5 μm on the PET film. Further, the resin solution (B-2) prepared in Resin synthesis example 4 was coated on the polyorganosiloxane layer by using a blade knife, and then, heated in a dryer at 90° C. for 30 minutes to form a film (B-3) having resin layers with a thickness of 75 μm on the PET film. The film (B-3) is a film having a two-layer structure comprising the thermoplastic polyorganosiloxane layer obtained by the resin solution (A-1) with a thickness of 5 μm and the radiation-curable modified siloxane layer obtained by the resin solution (B-2) with a thickness of 70 μm.

Examples 1 to 4 and Comparative Examples 1 and 2

By using the materials synthesized as mentioned above, bonding of the support and the wafer was carried out under the conditions shown in Table 1. Using 200 mm silicon wafer (thickness: 725 μm) having copper posts with a height of 10 μm and a diameter of 40 μm distributed over its entire front surface, (A-1) and (A-2) were spin coated on the bump-formed surface of the wafer with the thickness shown in Table 1. On the other hand, a glass plate having a diameter of 200 mm (thickness: 500 μm) was used as a support. To the support was firstly coated the (A-1) layer by spin coating, and further (B-1) and (B-2) were formed on the (A-1) layer by spin coating whereby two layers of a polyorganosiloxane layer (A') and a radiation curable modified siloxane layer (B) were formed. At this time, in either of the cases, after coating the resin, the coated material was heated on a hot plate at 120° C. for 2 minutes. On the other hand, the film (B-3) was so laminated that the polyorganosiloxane layer is contacted to the glass support using a vacuum laminator (TEAM-100, product of Takatori Co., Ltd.) at a wafer stage temperature of 100° C. and in a vacuum of 100 Pa, then, holding for 10 seconds and opening to air to mold a film having a thickness shown in Table 1. As mentioned above, the silicon wafer and the glass plate each having a resin layer were adhered so that the respective resin surfaces were mated together under the conditions shown in Table 1 in a vacuum adhering apparatus to prepare a laminate (pressure bonding conditions).

Thereafter, light with a wavelength of 254 nm was exposed from the glass plate with an exposure amount of 1000 mJ/cm$^2$, and then, heated at 90° C. for 60 minutes to cure the layer (B).

Thereafter, the following tests were carried out. The results are shown in Table 1.

—Adhesion Test—

A wafer with a diameter of 200 mm was bonded by using a wafer bonding apparatus EVG520IS of EVG. Bonding was carried out at a bonding temperature as shown in Table 1, a chamber internal pressure at the bonding of 10$^{-3}$ mbar or less, and a load of 5 kN. After bonding, the substrate was once heated in an oven at 180° C. for 1 hour to heighten curing degree of layer (B). After cooling to room temperature, the adhered state of the interface was confirmed with eyes. The sample was evaluated good when no defectives like bubbles at the interface was found and showed with "good", and poor when defectives were found and showed with "poor".

—Back Surface Grinding Resistance Test—

The back surface of a silicon wafer was ground by a grinder (DAG810 product of DISCO. Co., Ltd.) having a diamond abrasive wheel. After the wafer was ground to a final thickness of the substrate of 50 μm, it was observed for the presence or absence of defectives such as cracks and stripping under an optical microscope (100-fold). The sample was evaluated good when no defectives was found and showed with "good", and poor when defectives were found and showed with "poor".

—Heat Resistance Test—

The laminate after the back surface of the silicon wafer had been ground was placed in an oven at 250° C. for 2 hours under nitrogen atmosphere, and then, heated on a hot plate at 270° C. for 10 minutes. Then, the presence or absence of abnormality in the appearance was examined. The sample was evaluated good when no appearance abnormalities was found and showed with "good", and poor when appearance abnormalities were found and showed with "poor".

—Delaminatability Test—

The ability of delamination of the substrate was evaluated by adhering a dicing tape using a dicing frame to a wafer side thinned to 50 μm, and the dicing tape surface was set to the chuck platen by vacuum chucking. Thereafter, the glass substrate was released by pulling it up at one point of the glass (support) using a pair of tweezers at room temperature.

The sample was evaluated good when the glass can be released without cracking the 50 μm wafer and showed with "good", and poor when anomalies such as crack generated and showed with "poor".

—Cleaning Removability Test—

The 200 mm wafer (which had been exposed to the heat resistance test conditions) mounted on the dicing frame via the dicing tape after completion of the above-mentioned delaminatability test was set on a spin coater, with the adhesive layer upside. Isododecane was sprayed for 3 minutes as a cleaning solution, and then, rinsing was carried out by spraying isopropyl alcohol (IPA) while rotating the wafer. Thereafter, appearance of the wafer was observed, and the presence or absence of the remaining adhesive resin was checked with eyes. The sample was evaluated good in the absence of residual resin and showed with "good", and poor in the presence of the residual resin and showed with "poor".

TABLE 1

|  | Example 1 | Example 2 | Example 3 | Example 4 | Comparative Example 1 | Comparative Example 2 |
|---|---|---|---|---|---|---|
| Resin layer (A) | A-1 | A-2 | A-1 | A-1 | A-1 | None |
| Layer thickness of Layer (A) | 5 μm | 7 μm | 5 μm | 3 μm | 5 μm | — |
| Resin layer (B) | B-1 | B-2 | B-2 | B-2 contained in B-3 | None | B-1 |
| Layer thickness of Layer (B) | 30 μm | 50 μm | 50 μm | 70 μm | — | 30 μm |
| Resin layer (A') | A-1 | A-1 | A-1 | A-1 contained in B-3 | A-2 | A-1 |
| Layer thickness of Layer (A') | 2 μm | 5 μm | 2 μm | 5 μm | 7 μm | 2 μm |
| Adhesion temperature | 160° C. | 120° C. | 120° C. | 120° C. | 100° C. | 160° C. |
| Adhesiveness | good | good | good | good | good | good |
| Resistance to back surface grinding | good | good | good | good | poor | good |
| Heat resistance | good | good | good | good | — | good |
| delaminatability | good | good | good | good | — | good |
| cleaning removability | good | good | good | good | — | poor |

As in Comparative Example 1, when the second temporary adhesive layer (B) is not present, back surface grinding resistance was poor, and as in Comparative Example 2, when the first temporary adhesive layer (A) is not present, peeling could be done between the second temporary adhesive layer (B) and the third temporary adhesive layer (A'), but the second temporary adhesive layer (B) was remained at the wafer side and this could not be removed. On the other hand, in Examples 1 to 4, these could be released neatly between the interface of the first temporary adhesive layer (A) and the second temporary adhesive layer (B) or the interface of the third temporary adhesive layer (A') and the second temporary adhesive layer (B).

The invention claimed is:

1. A wafer processing laminate comprising a support, a temporary adhesive material layer formed thereon and a wafer laminated on the temporary adhesive material layer, where the wafer has a circuit-forming front surface and a back surface to be processed,
wherein the temporary adhesive material layer comprises a three-layered structure complex temporary adhesive material layer comprising a first temporary adhesive layer of a thermoplastic organopolysiloxane polymer layer (A) releasably adhered on a surface of the wafer, a second temporary adhesive layer of a radiation curable polymer layer (B) laminated on the first temporary adhesive layer, and a third temporary adhesive layer of a thermoplastic organopolysiloxane polymer layer (A') laminated on the second temporary adhesive layer and releasably adhered to the support.

2. The wafer processing laminate according to claim 1, wherein the thermoplastic organopolysiloxane polymer layer (A) and the thermoplastic organopolysiloxane polymer layer (A') each are an unreactive organopolysiloxane layer containing 99,000 to 99.999 mole % of a siloxane unit (D unit) represented by $R^{11}R^{12}SiO_{2/2}$, 1.000 to 0.001 mole % of a siloxane unit (M unit) represented by $R^{13}R^{14}R^{15}SiO_{1/2}$, and 0.000 to 0.500 mole % of a siloxane unit (T unit) represented by $R^{16}SiO_3$ where $R^{11}$, $R^{12}$, $R^{13}$, $R^{14}$, $R^{15}$ and $R^{16}$ each represent an unsubstituted or substituted monovalent hydrocarbon group, wherein the unreactive organopolysiloxane has having a weight average molecular weight of 200,000 to 1,000,000, and containing 0.5% by mass or less of a low molecular weight component having a molecular weight of 740 or less.

3. The wafer processing laminate according to claim 1, wherein the radiation curable polymer layer (B) is a cured product layer of a composition comprising 100 parts by mass of a radiation curable modified siloxane polymer which comprises an epoxy group-containing silicone polymer compound having a recurring unit represented by the following formula (1) and having a weight average molecular weight of 3,000 to 500,000, 0.1 to 50 parts by mass of one or more cross-linking agents selected from a compound having 2 or more phenolic hydroxyl groups on an average in one molecule, and a compound having 2 or more epoxy groups on an average in one molecule, and 0.05 to 20 parts by mass of a photoacid generator generating an acid by photoirradiation in the range of 240 nm to 500 nm,

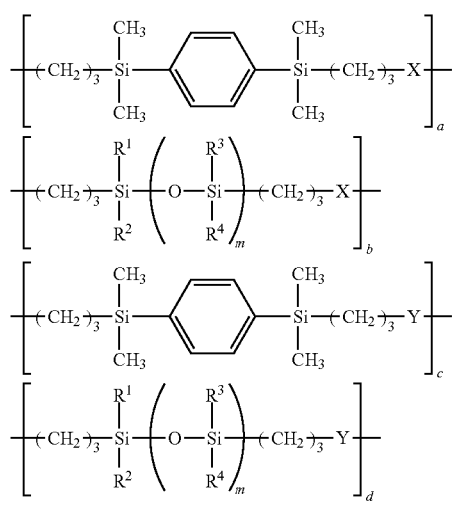

wherein $R^1$ to $R^4$ may be the same or different from each other and each represent a monovalent hydrocarbon group having 1 to 8 carbon atoms; "m" represents an integer of 1 to 100; "a", "b", "c" and "d" are each 0 or a positive number, and a+b+c+d=1, wherein "c" and "d" are not simultaneously 0; and 0<(c+d)/(a+b+c+d) ≤1.0; and X represents a divalent organic group represented by the following formula (2); and Y represents a divalent organic group represented by the following formula (3),

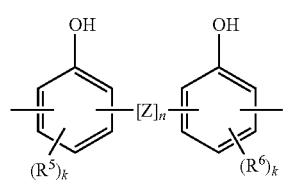

wherein Z represents a divalent organic group selected from the following,

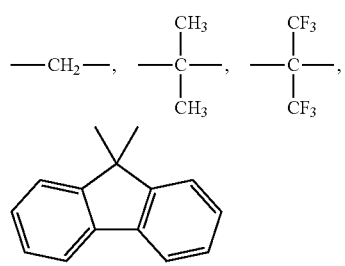

"n" represents 0 or 1; $R^5$ and $R^6$ each represent an alkyl group or an alkoxy group each having 1 to 4 carbon atoms and each may be the same or different from each other; and "k" represents 0, 1 or 2;

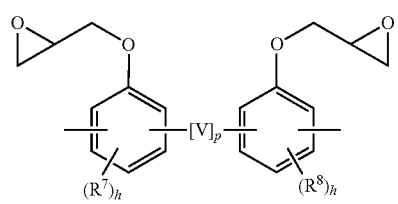

wherein V represents a divalent organic group selected from the following,

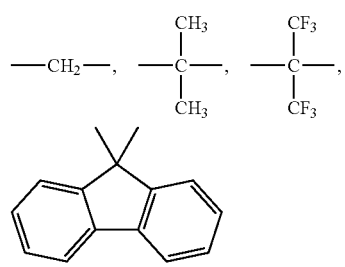

"p" represents 0 or 1; $R^7$ and $R^8$ each represent an alkyl group or an alkoxy group each having 1 to 4 carbon atoms and each may be the same or different from each other; and "h" represents 0, 1 or 2.

4. The wafer processing laminate according to claim 2, wherein the radiation curable polymer layer (B) is a cured product layer of a composition comprising 100 parts by mass of a radiation curable modified siloxane polymer which comprises an epoxy group-containing silicone polymer compound having a recurring unit represented by the following formula (1) and having a weight average molecular weight of 3,000 to 500,000, 0.1 to 50 parts by mass of one or more cross-linking agents selected from a compound having 2 or more phenolic hydroxyl groups on an average in one molecule, and a compound having 2 or more epoxy groups on an average in one molecule, and 0.05 to 20 parts by mass of a photoacid generator generating an acid by photoirradiation in the range of 240 nm to 500 nm,

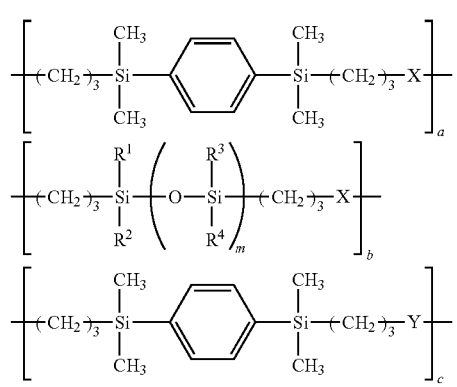

-continued

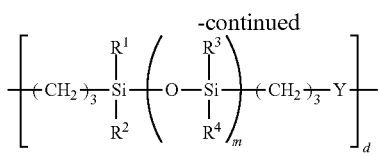

wherein $R^1$ to $R^4$ may be the same or different from each other and each represent a monovalent hydrocarbon group having 1 to 8 carbon atoms; "m" represents an integer of 1 to 100; "a", "b", "c" and "d" are each 0 or a positive number, and a+b+c+d=1, wherein "c" and "d" are not simultaneously 0; and 0<(c+d)/(a+b+c+d) ≤1.0; and X represents a divalent organic group represented by the following formula (2); and Y represents a divalent organic group represented by the following formula (3),

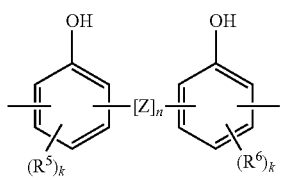 (2)

wherein Z represents a divalent organic group selected from the following,

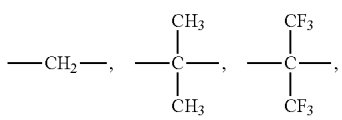

"n" represents 0 or 1; $R^5$ and $R^6$ each represent an alkyl group or an alkoxy group each having 1 to 4 carbon atoms and each may be the same or different from each other; and "k" represents 0, 1 or 2;

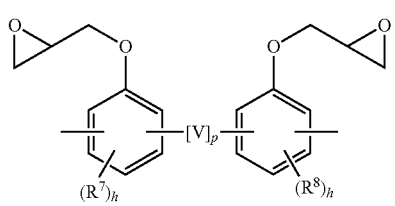 (3)

wherein V represents a divalent organic group selected from the following,

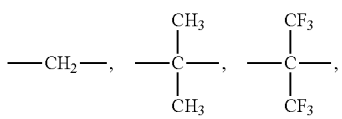

-continued

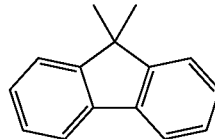

"p" represents 0 or 1; $R^7$ and $R^8$ each represent an alkyl group or an alkoxy group each having 1 to 4 carbon atoms and each may be the same or different from each other; and "h" represents 0, 1 or 2.

5. A method for manufacturing a thin wafer which comprises the steps of:
  (a) a step of bonding a wafer to a support via a temporary adhesive material layer, used for the wafer processing laminate according to claim 1, the layer comprising the thermoplastic organopolysiloxane polymer layer (A), the radiation curable polymer layer (B), and the thermoplastic organopolysiloxane polymer layer (A'), where the wafer has a circuit-forming front surface and a non-circuit-forming back surface, with the circuit-forming surface being bonded to the support, and curing the radiation curable polymer layer (B) by radiation,
  (b) a step of grinding or polishing the non-circuit-forming surface of the wafer bonded to the support,
  (c) a step of processing the non-circuit-forming surface of the wafer, and
  (d) a step of delaminating the processed wafer from the support.

6. A method for manufacturing a thin wafer which comprises the steps of:
  (a) a step of bonding a wafer to a support via a temporary adhesive material layer, used for the wafer processing laminate according to claim 2, the layer comprising the thermoplastic organopolysiloxane polymer layer (A), the radiation curable polymer layer (B), and the thermoplastic organopolysiloxane polymer layer (A'), where the wafer has a circuit-forming front surface and a non-circuit-forming back surface, with the circuit-forming surface being bonded to the support, and curing the radiation curable polymer layer (B) by radiation,
  (b) a step of grinding or polishing the non-circuit-forming surface of the wafer bonded to the support,
  (c) a step of processing the non-circuit-forming surface of the wafer, and
  (d) a step of delaminating the processed wafer from the support.

7. A method for manufacturing a thin wafer which comprises the steps of:
  (a) a step of bonding a wafer to a support via a temporary adhesive material layer, used for the wafer processing laminate according to claim 3, the layer comprising the thermoplastic organopolysiloxane polymer layer (A), the radiation curable polymer layer (B), and the thermoplastic organopolysiloxane polymer layer (A'), where the wafer has a circuit-forming front surface and a non-circuit-forming back surface, with the circuit-forming surface being bonded to the support, and curing the radiation curable polymer layer (B) by radiation,
  (b) a step of grinding or polishing the non-circuit-forming surface of the wafer bonded to the support,
  (c) a step of processing the non-circuit-forming surface of the wafer, and (d) a step of delaminating the processed wafer from the support.

8. A method for manufacturing a thin wafer which comprises the steps of:
(a) a step of bonding a wafer to a support via a temporary adhesive material layer, used for the wafer processing laminate according to claim 4, the layer comprising the thermoplastic organopolysiloxane polymer layer (A), the radiation curable polymer layer (B), and the thermoplastic organopolysiloxane polymer layer (A'), where the wafer has a circuit-forming front surface and a non-circuit-forming back surface, with the circuit-forming surface being bonded to the support, and curing the radiation curable polymer layer (B) by radiation,
(b) a step of grinding or polishing the non-circuit-forming surface of the wafer bonded to the support,
(c) a step of processing the non-circuit-forming surface of the wafer, and
(d) a step of delaminating the processed wafer from the support.

9. The manufacturing method of a thin wafer according to claim 5, wherein (d) the step of delaminating the processed wafer from the support comprises
(e) a step of adhering a dicing tape to the wafer surface of the processed wafer,
(f) a step of subjecting a dicing tape surface to vacuum chucking to a chuck surface, and
(g) a step of delaminating the support from the processed wafer at a temperature of the chuck surface in a temperature range of 10° C. to 100° C.

10. The manufacturing method of a thin wafer according to claim 6, wherein (d) the step of delaminating the processed wafer from the support comprises
(e) a step of adhering a dicing tape to the wafer surface of the processed wafer,
(f) a step of subjecting a dicing tape surface to vacuum chucking to a chuck surface, and
(g) a step of delaminating the support from the processed wafer at a temperature of the chuck surface in a temperature range of 10° C. to 100° C.

11. The manufacturing method of a thin wafer according to claim 7, wherein (d) the step of delaminating the processed wafer from the support comprises
(e) a step of adhering a dicing tape to the wafer surface of the processed wafer,
(f) a step of subjecting a dicing tape surface to vacuum chucking to a chuck surface, and
(g) a step of delaminating the support from the processed wafer at a temperature of the chuck surface in a temperature range of 10° C. to 100° C.

12. The manufacturing method of a thin wafer according to claim 8, wherein (d) the step of delaminating the processed wafer from the support comprises
(e) a step of adhering a dicing tape to the wafer surface of the processed wafer,
(f) a step of subjecting a dicing tape surface to vacuum chucking to a chuck surface, and
(g) a step of delaminating the support from the processed wafer at a temperature of the chuck surface in a temperature range of 10° C. to 100° C.

13. The manufacturing method of a thin wafer according to claim 5, wherein (h) a step of removing the temporary adhesive material layer remained at the circuit-forming surface of the delaminated wafer is carried out after (d) the step of delaminating the processed wafer from the support.

14. The manufacturing method of a thin wafer according to claim 6, wherein (h) a step of removing the temporary adhesive material layer remained at the circuit-forming surface of the delaminated wafer is carried out after (d) the step of delaminating the processed wafer from the support.

15. The manufacturing method of a thin wafer according to claim 7, wherein (h) a step of removing the temporary adhesive material layer remained at the circuit-forming surface of the delaminated wafer is carried out after (d) the step of delaminating the processed wafer from the support.

16. The manufacturing method of a thin wafer according to claim 8, wherein (h) a step of removing the temporary adhesive material layer remained at the circuit-forming surface of the delaminated wafer is carried out after (d) the step of delaminating the processed wafer from the support.

17. The manufacturing method of a thin wafer according to claim 9, wherein (h) a step of removing the temporary adhesive material layer remained at the circuit-forming surface of the delaminated wafer is carried out after (d) the step of delaminating the processed wafer from the support.

18. The manufacturing method of a thin wafer according to claim 10, wherein (h) a step of removing the temporary adhesive material layer remained at the circuit-forming surface of the delaminated wafer is carried out after (d) the step of delaminating the processed wafer from the support.

19. The manufacturing method of a thin wafer according to claim 11, wherein (h) a step of removing the temporary adhesive material layer remained at the circuit-foaming surface of the delaminated wafer is carried out after (d) the step of delaminating the processed wafer from the support.

20. The manufacturing method of a thin wafer according to claim 12, wherein (h) a step of removing the temporary adhesive material layer remained at the circuit-forming surface of the delaminated wafer is carried out after (d) the step of delaminating the processed wafer from the support.

21. A wafer processing member comprising a support and a temporary adhesive material layer formed thereon, where the wafer can have a circuit-forming front surface and a back surface to be processed, and the wafer can be temporarily adhered on the temporary adhesive material layer,
wherein the temporary adhesive material layer comprises a third temporary adhesive layer of a thermoplastic organopolysiloxane polymer layer (A') releasably adhered to the support, a second temporary adhesive layer of a radiation curable polymer layer (B) laminated on the third temporary adhesive layer, and a first temporary adhesive layer of a thermoplastic organopolysiloxane polymer layer (A) laminated on the second temporary adhesive layer and can be releasably adherable to the front surface of the wafer.

22. The wafer processing member according to claim 21, wherein the thermoplastic organopolysiloxane polymer layer (A) and the thermoplastic organopolysiloxane polymer layer (A') each are an unreactive organopolysiloxane layer containing 99.000 to 99.999 mole % of a siloxane unit (D unit) represented by $R^{11}R^{12}SiO_{2/2}$, 1.000 to 0.001 mole % of a siloxane unit (M unit) represented by $R^{13}R^{14}R^{15}SiO_{1/2}$, and 0.000 to 0.500 mole % of a siloxane unit (T unit) represented by $R^{16}SiO_{3/2}$, $R^{11}$, $R^{12}$, $R^{13}$, $R^{14}$, $R^{15}$ and $R^{16}$ each represent an unsubstituted or substituted monovalent hydrocarbon group, wherein the unreactive organopolysiloxane has a weight average molecular weight of 200,000 to 1,000,000, and containing 0.5% by mass or less of a low molecular weight component having a molecular weight of 740 or less.

23. The wafer processing member according to claim 21, wherein the radiation curable polymer layer (B) is a cured product layer of a composition comprising 100 parts by mass of a radiation curable modified siloxane polymer which comprises an epoxy group-containing silicone polymer compound having a recurring unit represented by the following formula (1) and having a weight average molecular weight of 3,000 to 500,000, 0.1 to 50 parts by mass of one or more cross-linking agents selected from a compound having 2 or more phenolic hydroxyl groups on an average in one molecule, and a compound having 2 or more epoxy groups on an average in one molecule, and 0.05 to 20 parts by mass of a photoacid generator generating an acid by photoirradiation in the range of 240 nm to 500 nm,

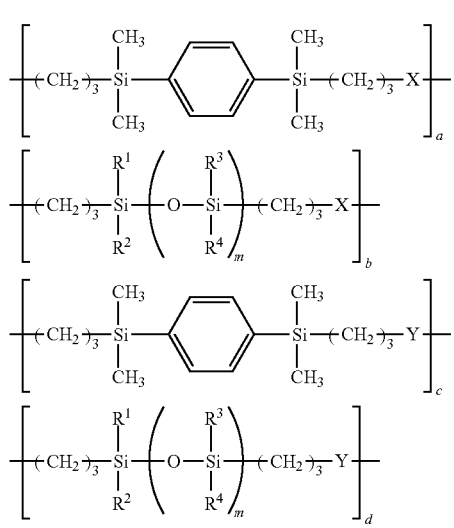

(1)

wherein $R^1$ to $R^4$ may be the same or different from each other and each represent a monovalent hydrocarbon group having 1 to 8 carbon atoms; "m" represents an integer of 1 to 100; "a", "b", "c" and "d" are each 0 or a positive number, and a+b+c+d=1, wherein "c" and "d" are not simultaneously 0; and 0<(c+d)/(a+b+c+d) ≤1.0; and X represents a divalent organic group represented by the following formula (2); and Y represents a divalent organic group represented by the following formula (3),

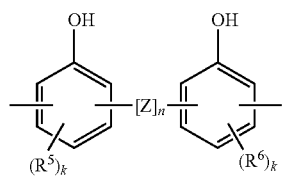

(2)

wherein Z represents a divalent organic group selected from the following,

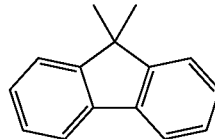

"n" represents 0 or 1; $R^5$ and $R^6$ each represent an alkyl group or an alkoxy group each having 1 to 4 carbon atoms and each may be the same or different from each other; and "k" represents 0, 1 or 2,

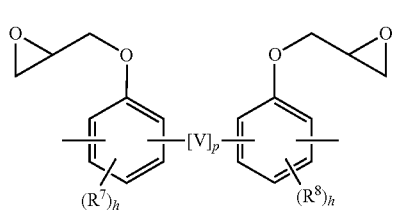

(3)

wherein V represents a divalent organic group selected from the following,

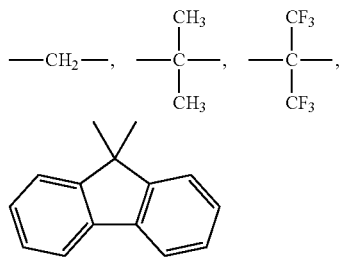

"p" represents 0 or 1; $R^7$ and $R^8$ each represent an alkyl group or an alkoxy group each having 1 to 4 carbon atoms and each may be the same or different from each other; and "h" represents 0, 1 or 2.

24. The wafer processing member according to claim 22, wherein the radiation curable polymer layer (B) is a cured product layer of a composition comprising 100 parts by mass of a radiation curable modified siloxane polymer which comprises an epoxy group-containing silicone polymer compound having a recurring unit represented by the following formula (1) and having a weight average molecular weight of 3,000 to 500,000, 0.1 to 50 parts by mass of one or more cross-linking agents selected from a compound having 2 or more phenolic hydroxyl groups on an average in one molecule, and a compound having 2 or more epoxy groups on an average in one molecule, and 0.05 to 20 parts by mass of a photoacid generator generating an acid by photoirradiation in the range of 240 nm to 500 nm,

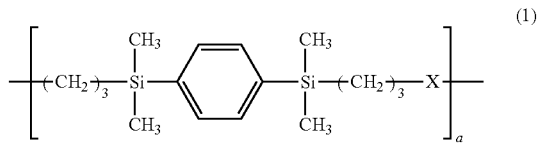

(1)

-continued

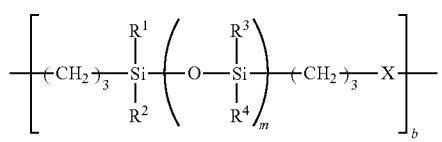

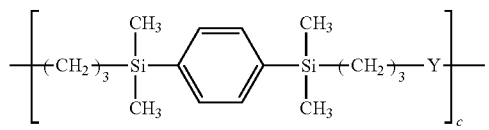

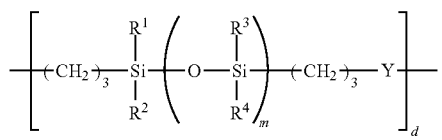

wherein $R^1$ to $R^4$ may be the same or different from each other and each represent a monovalent hydrocarbon group having 1 to 8 carbon atoms; "m" represents an integer of 1 to 100; "a", "b", "c" and "d" are each 0 or a positive number, and a+b+c+d=1, wherein "c" and "d" are not simultaneously 0; and $0<(c+d)/(a+b+c+d) \leq 1.0$; and X represents a divalent organic group represented by the following formula (2); and Y represents a divalent organic group represented by the following formula (3),

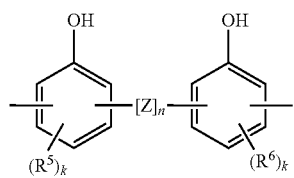 (2)

wherein Z represents a divalent organic group selected from the following,

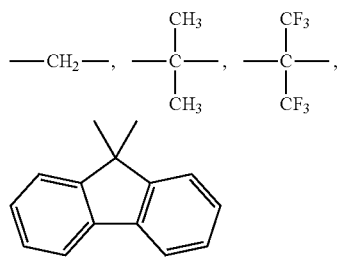

"n" represents 0 or 1; $R^5$ and $R^6$ each represent an alkyl group or an alkoxy group each having 1 to 4 carbon atoms and each may be the same or different from each other; and "k" represents 0, 1 or 2,

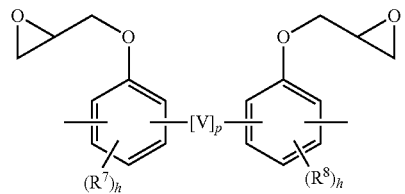 (3)

wherein V represents a divalent organic group selected from the following,

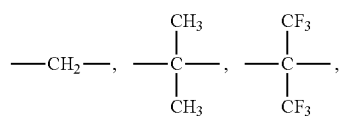

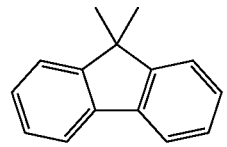

"p" represents 0 or 1; $R^7$ and $R^8$ each represent an alkyl group or an alkoxy group each having 1 to 4 carbon atoms and each may be the same or different from each other; and "h" represents 0, 1 or 2.

25. A temporary adhering material for processing a wafer which is a material for temporary adhering a wafer to a support, where the wafer can have has a circuit-forming front surface and a back surface to be processed,
wherein the material comprises a first temporary adhesive layer of a thermoplastic organopolysiloxane polymer layer (A) can be releasably adherable to the front surface of the wafer, a second temporary adhesive layer of a radiation curable polymer layer (B) laminated on the first temporary adhesive layer, and a third temporary adhesive layer of a thermoplastic organopolysiloxane polymer layer (A') laminated on the second temporary adhesive layer and releasably adherable to the support.

26. The temporary adhering material for processing a wafer according to claim 25, wherein the thermoplastic organopolysiloxane polymer layer (A) and the thermoplastic organopolysiloxane polymer layer (A') are each an unreactive organopolysiloxane layer containing 99.000 to 99.999 mole % of a siloxane unit (D unit) represented by $R^{11}R^{12}SiO_{2/2}$, 1.000 to 0.001 mole % of a siloxane unit (M unit) represented by $R^{13}R^{14}R^{15}SiO_{1/2}$, and 0.000 to 0.500 mole % of a siloxane unit (T unit) represented by $R^{16}SiO_{3/2}$, where $R^{11}$, $R^{12}$, $R^{13}$, $R^{14}$, $R^{15}$ and $R^{16}$ each represent an unsubstituted or substituted monovalent hydrocarbon group, wherein the unreactive organopolysiloxane has a weight average molecular weight of 200,000 to 1,000,000, and containing 0.5% by mass or less of a low molecular weight component having a molecular weight of 740 or less.

27. The temporary adhering material for processing a wafer according to claim 25, wherein the radiation curable polymer layer (B) is a cured product layer of a composition comprising 100 parts by mass of a radiation curable modified siloxane polymer which comprises an epoxy group-containing silicone polymer compound having a recurring unit represented by the following formula (1) and having a weight average molecular weight of 3,000 to 500,000, 0.1 to 50 parts by mass of one or more cross-linking agents selected from a compound having 2 or more phenolic hydroxyl groups on an average in one molecule, and a compound having 2 or more epoxy groups on an average in one molecule, and 0.05 to 20 parts by mass of a photoacid generator generating an acid by photoirradiation in the range of 240 nm to 500 nm,

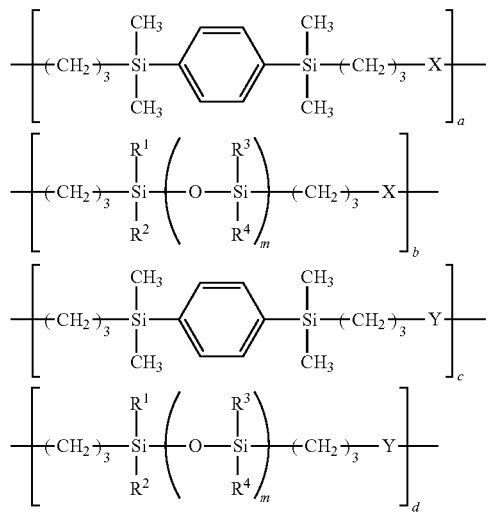

wherein $R^1$ to $R^4$ may be the same or different from each other and each represent a monovalent hydrocarbon group having 1 to 8 carbon atoms; "m" represents an integer of 1 to 100; "a", "b", "c" and "d" are each 0 or a positive number, and a+b+c+d=1, wherein "c" and "d" are not simultaneously 0; and 0<(c+d)/(a+b+c+d) ≤1.0; and X represents a divalent organic group represented by the following formula (2); and Y represents a divalent organic group represented by the following formula (3),

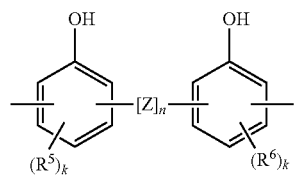

wherein Z represents a divalent organic group selected from the following,

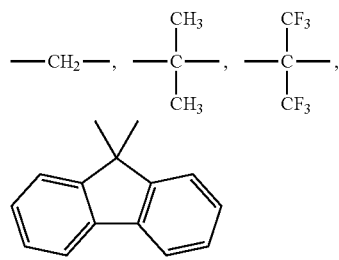

"n" represents 0 or 1; $R^5$ and $R^6$ each represent an alkyl group or an alkoxy group each having 1 to 4 carbon atoms and each may be the same or different from each other; and "k" represents 0, 1 or 2,

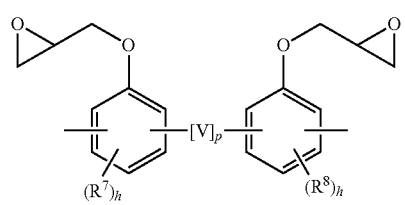

wherein V represents a divalent organic group selected from the following,

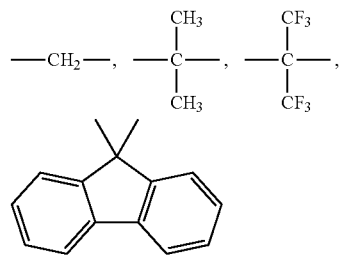

"p" represents 0 or 1; $R^7$ and $R^8$ each represent an alkyl group or an alkoxy group each having 1 to 4 carbon atoms and each may be the same or different from each other; and "h" represents 0, 1 or 2.

28. The temporary adhering material for processing a wafer according to claim 26, wherein the radiation curable polymer layer (B) is a cured product layer of a composition comprising 100 parts by mass of a radiation curable modified siloxane polymer which comprises an epoxy group-containing silicone polymer compound having a recurring unit represented by the following formula (1) and having a weight average molecular weight of 3,000 to 500,000, 0.1 to 50 parts by mass of one or more cross-linking agents selected from a compound having 2 or more phenolic hydroxyl groups on an average in one molecule, and a compound having 2 or more epoxy groups on an average in one molecule, and 0.05 to 20 parts by mass of a photoacid generator generating an acid by photoirradiation in the range of 240 nm to 500 nm,

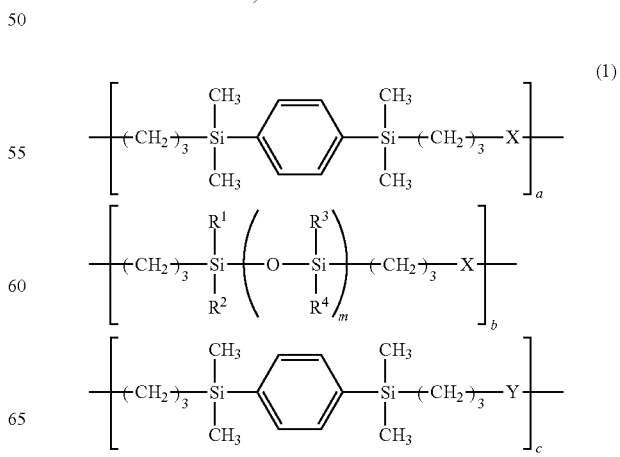

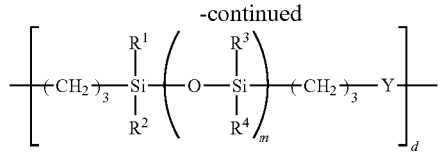

wherein $R^1$ to $R^4$ may be the same or different from each other and each represent a monovalent hydrocarbon group having 1 to 8 carbon atoms; "m" represents an integer of 1 to 100; "a", "b", "c" and "d" are each 0 or a positive number, and a+b+c+d=1, wherein "c" and "d" are not simultaneously 0; and 0<(c+d)/(a+b+c+d) ≤1.0; and X represents a divalent organic group represented by the following formula (2); and Y represents a divalent organic group represented by the following formula (3),

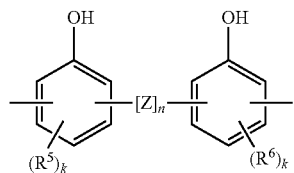 (2)

wherein Z represents a divalent organic group selected from the following,

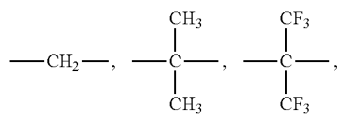

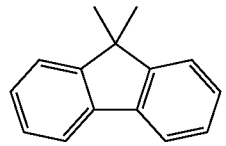

"n" represents 0 or 1; $R^5$ and $R^6$ each represent an alkyl group or an alkoxy group each having 1 to 4 carbon atoms and each may be the same or different from each other; and "k" represents 0, 1 or 2,

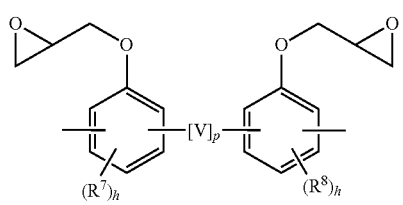 (3)

wherein V represents a divalent organic group selected from the following,

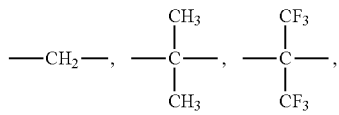

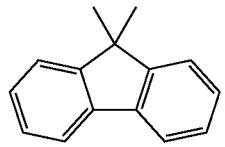

"p" represents 0 or 1; $R^7$ and $R^8$ each represent an alkyl group or an alkoxy group each having 1 to 4 carbon atoms and each may be the same or different from each other; and "h" represents 0, 1 or 2.

* * * * *